(12) United States Patent
Wandres et al.

(10) Patent No.: US 10,739,404 B2
(45) Date of Patent: Aug. 11, 2020

(54) DEVICE AND METHOD FOR TESTING THE SWITCHING STATE OF A CIRCUIT BREAKER DEVICE

(71) Applicant: Eberspächer Controls Landau GmbH & Co. KG, Landau (DE)

(72) Inventors: Steffen Wandres, Kandel (DE); Mark Weimann, Mackenbach (DE); Oliver Merkel, Dörrenbach (DE); Florian Werling, Landau in der Pfalz (DE)

(73) Assignee: EBERSPÄCHER CONTROLS LANDAU GMBH & CO. KG, Landau (DE)

( * ) Notice: Subject to any disclaimer, the term of this patent is extended or adjusted under 35 U.S.C. 154(b) by 126 days.

(21) Appl. No.: 15/943,892

(22) Filed: Apr. 3, 2018

(65) Prior Publication Data

US 2018/0284193 A1     Oct. 4, 2018

(30) Foreign Application Priority Data

Apr. 4, 2017 (DE) ........................ 10 2017 107 160

(51) Int. Cl.
  *G01R 31/327* (2006.01)
  *H02H 3/05* (2006.01)
  (Continued)

(52) U.S. Cl.
  CPC ....... *G01R 31/327* (2013.01); *G01R 31/3277* (2013.01); *H02H 3/044* (2013.01);
  (Continued)

(58) Field of Classification Search
  CPC ....... G01R 31/327–3336; H03K 17/18; H03K 17/56; H03K 17/687; H02H 3/044
  See application file for complete search history.

(56) References Cited

U.S. PATENT DOCUMENTS

| | | | | |
|---|---|---|---|---|
| 4,870,532 A | * | 9/1989 | Beatty, Jr. | H02H 3/044 361/93.7 |
| 5,030,821 A | * | 7/1991 | Fukuyama | H03K 17/18 250/214 AG |

(Continued)

FOREIGN PATENT DOCUMENTS

| | | |
|---|---|---|
| DE | 101 55 847 A1 | 5/2003 |
| DE | 603 19 177 T2 | 2/2009 |

(Continued)

*Primary Examiner* — Huy Q Phan
*Assistant Examiner* — David B Frederiksen
(74) *Attorney, Agent, or Firm* — McGlew and Tuttle, P.C.

(57) ABSTRACT

A method tests a switching state of a circuit breaker device (10) for establishing/breaking a connection of two circuit areas (12, 14), especially in a vehicle. The circuit breaker device includes at least one MOSFET switching element (20) with a source terminal (22) connected with one of the circuit areas (12, 14) and a drain terminal (24) connected with another of the circuit areas (12, 14). A gate driver (26) is associated with the switching element (20) for switching into a connection switching state. The method includes applying a testing voltage pulse to the drain terminal, detecting a voltage drop between the drain terminal and the source terminal, comparing the voltage drop detected with a voltage reference or/and with a time reference, and determining, based on the comparison, an actual switching state of the at least one MOSFET switching element (20) being subjected to the switching state test.

20 Claims, 2 Drawing Sheets

(51) Int. Cl.
*H03K 17/687* (2006.01)
*G01R 31/00* (2006.01)
*H03K 17/18* (2006.01)
*H02H 3/04* (2006.01)

(52) U.S. Cl.
CPC .......... *H03K 17/18* (2013.01); *H03K 17/687* (2013.01); *G01R 31/007* (2013.01); *H02H 3/05* (2013.01)

(56) References Cited

U.S. PATENT DOCUMENTS

| | | | |
|---|---|---|---|
| 2002/0145404 A1 | 10/2002 | Dasgupta et al. | |
| 2004/0189481 A1* | 9/2004 | Youssef | G08B 13/02 340/686.1 |
| 2004/0263201 A1* | 12/2004 | Kiep | H03K 17/063 324/762.08 |
| 2007/0132313 A1 | 6/2007 | Baeuerle | |
| 2011/0115527 A1* | 5/2011 | Quinones | H03K 17/18 327/77 |
| 2015/0160285 A1* | 6/2015 | Joh | G01R 31/2621 324/754.03 |
| 2015/0333568 A1* | 11/2015 | Batra | H02J 9/061 307/66 |
| 2016/0344178 A1* | 11/2016 | Wortberg | H02H 3/087 |
| 2018/0024196 A1* | 1/2018 | Imura | G01R 19/165 324/762.01 |

FOREIGN PATENT DOCUMENTS

| | | |
|---|---|---|
| DE | 10 2013 204 573 A1 | 9/2014 |
| EP | 1 742 076 A2 | 1/2007 |

\* cited by examiner

DEVICE AND METHOD FOR TESTING THE SWITCHING STATE OF A CIRCUIT BREAKER DEVICE

CROSS REFERENCE TO RELATED APPLICATIONS

This application claims the benefit of priority under 35 U.S.C. § 119 of German Application DE 10 2017 107 160.1, filed Apr. 4, 2017, the entire contents of which are incorporated herein by reference.

FIELD OF THE INVENTION

The present invention pertains to a method for testing the switching state of a circuit breaker device for establishing/breaking a connection of two circuit areas, especially in a vehicle.

BACKGROUND OF THE INVENTION

At least two voltage networks, each representing a circuit area in a vehicle, are provided, in general, in modern vehicles in order to supply the different electrical energy consumers during the operation of the vehicle. One of these voltage networks may be an on-board voltage network, in which, supplied from a first battery used as a voltage source, electrical energy consumers are supplied, which are to be supplied with electrical energy during the operation of the vehicle permanently and regardless of whether an internal combustion engine is operating or not. Another of these voltage networks may be a start voltage network, which is used primarily to also restart the internal combustion engine in a start-stop operation of an internal combustion engine after the internal combustion engine had been temporarily switched off, for example, with the vehicle stopped at a traffic light or during a coasting operation.

A circuit breaker device, which connects the two voltage networks or the voltage sources thereof to one another in a normal operating state, which does not lead to an overload especially of the on-board voltage network, is provided in association with such voltage networks, so that both voltage sources can be used and also recharged. In a state in which one of the voltage sources has a high load and thus a high voltage drop could also develop in the other voltage network, the two voltage networks can be disconnected from one another by the circuit breaker device. This may happen in the above-described example when the starting voltage network has a high load during the start of the internal combustion engine, but a load leading to an excessive voltage drop of the on-board voltage network must be ruled out.

SUMMARY OF THE INVENTION

An object of the present invention is to provide a method with which a reliable testing of the switching state of a circuit breaker device, which disconnects two circuit areas, e.g., voltage networks, from one another or connects them to one another, can be carried out.

This object is accomplished according to the present invention by a method for testing the switching state of a circuit breaker device for establishing/breaking a connection of two circuit areas, especially in a vehicle, wherein the circuit breaker device comprises at least one metal-oxide-semiconductor field-effect transistor or MOSFET switching element, wherein a source terminal of the at least one MOSFET switching element is in connection with a first of the circuit areas and a drain terminal of the at least one MOSFET switching element is in connection with a second of the circuit areas and wherein a gate driver is associated with the at least one MOSFET switching element for switching the at least one MOSFET switching element into a connection switching state connecting the two circuit areas to one another, wherein the method comprises the following steps:

a) application of at least one testing voltage pulse to the drain terminal of at least one MOSFET switching element to be subjected to a switching state test,
b) detection of a voltage drop between the drain terminal and the source terminal of the at least one MOSFET switching element subjected to the switching state test,
c) comparison of the voltage drop detected during step b) with a voltage reference or/and a time reference, and
d) determination, based on the comparison carried out in step c), of an actual switching state of the at least one MOSFET switching element subjected to the switching state test.

Regardless of the potential present on the terminals of the at least one MOSFET switching element being subjected to a switching state test, which terminals are in connection with the two voltage networks, it becomes possible with this method according to the present invention to generate a potential difference between the drain terminal and the source terminal of said MOSFET switching element by applying a defined voltage to the drain terminal of such a MOSFET switching element regardless of the switching state of this MOSFET switching element. Based on this detectable potential difference, the switching state of the tested MOSFET switching element can be reliably determined and it can be determined whether the current switching state thereof corresponds to a desired switching state predefined for this MOSFET switching element. It is of particular significance in this connection that the switching state of the MOSFET switching element being tested is basically not affected or changed by such a testing voltage pulse to be provided according to the present invention.

To ensure the reliable detection of the voltage drop to be expected between the drain terminal and the source terminal when the at least one testing voltage pulse is applied, on the one hand, and to rule out, on the other hand, an impairment of the system areas to be supplied via the voltage networks due to the application of the at least one testing voltage pulse, on the other hand, it is proposed that the at least one testing voltage pulse have a voltage, i.e., a pulse height in the range of 1 V to 4 V and preferably about 4 V.

It is especially advantageous in this connection if the at least one testing voltage pulse represents a potential difference relative to the source terminal of the at least one MOSFET switching element subjected to the switching state test. It can thus be ruled out that a voltage drop could not be detectable, regardless of the switching state, when the drain terminal and the source terminal of a MOSFET switching element being tested are at the same potential on application of the testing voltage pulse to the drain terminal.

To guarantee that not even an external short circuit brought about under unfavorable conditions between the two voltage networks or voltage sources to be connected to one another via the circuit breaker device can lead to an impairment of the testing of the state of the circuit breaker device, which is to be performed according to the present invention, it is proposed that the at least one testing voltage pulse have a pulse length in the range of 5 µsec to 15 µsec and preferably about 10 µsec. Concerning such a short pulse length, an external short circuit can be considered to be a high-impedance short circuit based on its comparatively high inductance, so that the potential difference to be generated by applying one or more testing voltage pulses between the drain terminal and the source terminal will nevertheless develop and is thus detectable. It should be noted that this pulse length is determined essentially by the fact that the charge carriers provided during the application of the voltage pulse at the drain terminal have flowed off essentially completely via the drain terminal and the second circuit area, which is connected to it and which can be considered to have low impedance, for example, in the case of a configuration as a voltage network, even when the MOSFET switching element is switched into the disconnection switching state.

To make it possible to detect or confirm a correct disconnection of the two voltage networks, it is proposed that the voltage reference comprise a first voltage threshold and that it be determined in step d) that the actual switching state is a disconnection switching state when the voltage drop is above the first voltage threshold in step c).

For the detection or confirmation of a correct connection of the two voltage networks, the voltage reference may comprise a second voltage threshold, and it is determined in step d) that the actual switching state is the connection switching state when the voltage drop is under the second voltage threshold in step c).

It is proposed according to an especially advantageous aspect of the method according to the present invention that the actual switching state determined in step d) be compared in a step e) with a desired switching state of the at least one switching element being subjected to the switching state test, and that a correct function of the at least one MOSFET switching element being subjected to the switching state test be recognized when the actual switching state corresponds to the desired switching state, or/and that the presence of a malfunction of the at least one MOSFET switching element being subjected to the switching state test be recognized when the actual switching state does not correspond to the desired switching state. It is not only possible in this manner to determine the actual switching state of such a switching element, but also to determine whether a switching state that is actually to be intended is indeed present.

Since it is particularly significant for the subsequent operation of a system configured with two voltage networks to guarantee that the desired switching state is indeed also present after performing a switching operation, it is proposed that the actual switching state of the at least one MOSFET switching element being subjected to the switching state test be determined within a predefined testing time interval after a change in a desired switching state of the at least one MOSFET switching element to be subjected to the switching state test. The testing time interval may be a comparatively short time interval after the switching operation had been performed in order to guarantee that it is ensured prior to taking further measures that the switching state necessary therefor is present. Such a time interval may be, for example, a duration in the range of milliseconds. The testing time interval may be, for example, a time interval in the range of 10 msec to 100 msec after the performance of a switching operation.

To also verify during a longer-lasting unchanged operation of the circuit breaker device that the latter continues to be in the switching state to be intended for the operation, the actual switching state of the at least one MOSFET switching element to be subjected to the switching state test can preferably be determined periodically repeatedly.

The at least one testing voltage pulse may be generated in a simple and reliable manner by the circuit breaker device comprising a testing voltage pulse generation device with a capacitance to source terminal and by the at least one testing voltage pulse being applied to the drain terminal of the at least one MOSFET switching element being subjected to the switching state test via a capacitance to source terminal.

The method according to the present invention may be used in an especially advantageous manner if the first circuit area comprises a first voltage network, preferably with a first voltage source, and if the second circuit area has a second voltage network, preferably with a second voltage source. The state of connection of the two voltage networks can thus be tested and verified, especially in a vehicle, so that a possibly safety-critical overload of one of the voltage networks by the other voltage network can be reliably prevented.

The present invention pertains, furthermore, to a method for testing the switching state of a circuit breaker device for establishing/breaking a connection of two circuit areas, especially in a vehicle, wherein the circuit breaker device comprises at least one switching element, wherein a first terminal of the at least one switching element is in connection with a first of the circuit areas and a second terminal of the at least one switching element is in connection with a second of the circuit areas, and wherein a switching terminal is provided in the at least one switching element for switching the at least one switching element into a switching state connecting the two circuit areas to one another, wherein the method comprises the following steps:

a) application of at least one testing voltage pulse to the first terminal or to the second terminal of at least one of a switching element to be subjected to a switching state test, b) detection of a voltage drop between the second terminal and the first terminal of the at least one switching element being subjected to the switching state test, c) comparison of the voltage drop detected during step b) with a voltage reference or/and with a time reference, and d) determination, based on the comparison carried out in step c), of an actual switching state of the at least one switching element being subjected to the switching state test.

The principles of the present invention can thus also be applied, in principle, in circuit breaker devices with switching elements having different configurations, e.g., relay switches.

The present invention will be described in detail below with reference to the attached figures. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
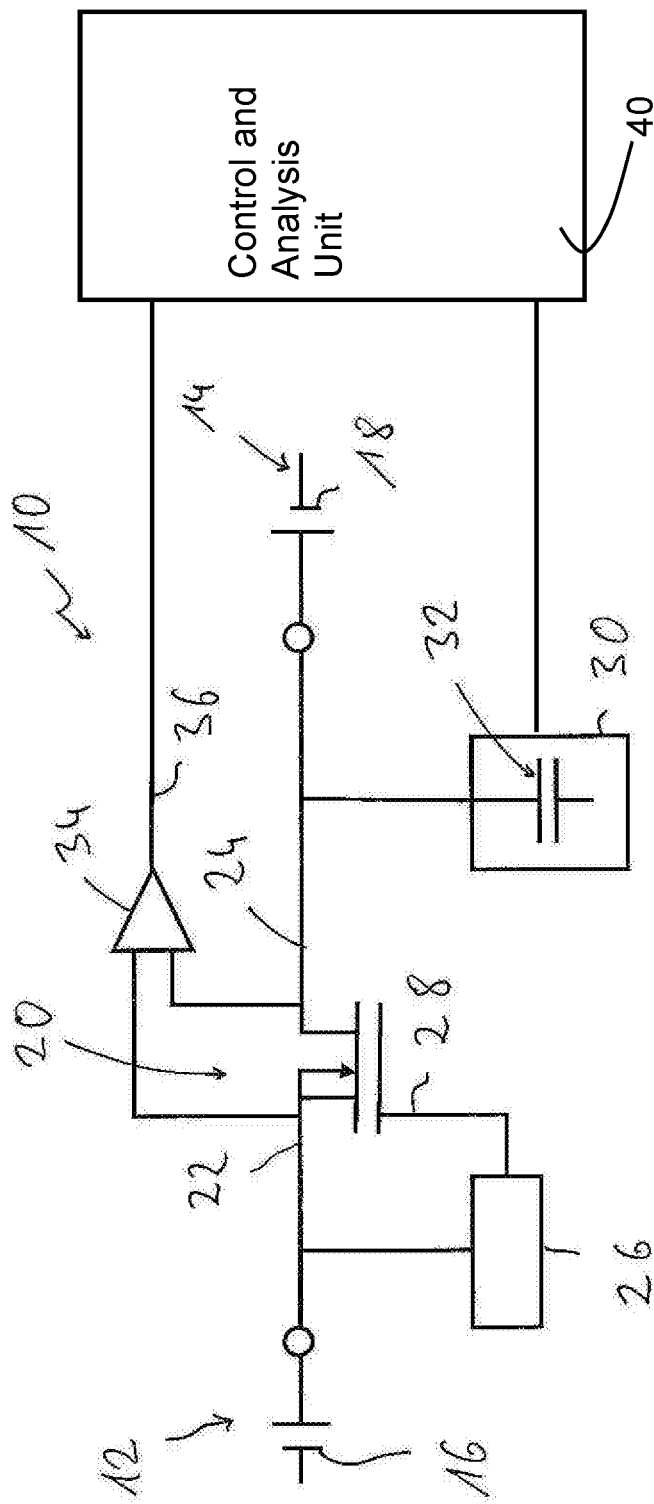
FIG. 1 is a schematic view of a MOSFET switching element of a circuit breaker device with a switching state testing controller, which switching element is to be tested according to the present invention.

Referring to the drawings, FIG. 1 shows, in a simplified and schematic manner, the configuration of a circuit breaker device, which is generally designated by 10 and which can be used, for example, in a vehicle, in order to connect two voltage networks 12, 14 or the voltage sources 16, 18 thereof, e.g., batteries, to one another and to break the connection between these voltage networks 12, 14 or the voltage sources 16, 18 thereof.

The circuit breaker device 10 comprises a switching arrangement comprising at least one MOSFET switching element 20 and preferably a plurality of MOSFET switching elements 20. A source terminal 22 of the MOSFET switching element 20 is connected to the voltage network 12 or to the +pole of the voltage source 16 thereof. A drain terminal 24 of the MOSFET switching element 20 is connected to the voltage network 14 or to the +pole of the voltage source 18 thereof. The MOSFET switching element 20 can be switched by means of a gate driver 26 or of a voltage to be applied between the source terminal 22 and a gate terminal 28 into a conducting state, i.e., a state establishing a connection between the drain terminal 24 and the source terminal 22, which state will hereinafter generally be called connection switching state. If no switching voltage switching the MOSFET switching element 20 into its conducting state is applied by the gate driver 26, the connection between the drain terminal 24 and the source terminal 22 is interrupted, so that the two voltage networks 12, 14 are disconnected from one another.

To determine the actual switching state of the MOSFET switching element 20 or to verify whether this switching element 20 is in a desired switching state intended for an instantaneous operation, a testing voltage pulse generated by a pulse generator is applied to the drain terminal 24 of the MOSFET switching element 20 according to the principles of the present invention by means of a testing voltage pulse generating device 30, especially by means of a capacitor 32 thereof, which capacitor provides a capacitance to the source terminal. The potential is raised by means of such a testing voltage pulse on the side of the drain terminal 24 to an extent corresponding to the level of the voltage pulse, for example, in relation to the potential present on the side of the source terminal 22. The consequence of this is that regardless of the respective potential that the source terminal 22 and the drain terminal 24 have, a potential difference can be built up between the drain terminal 24 and the source terminal 22 when a testing voltage pulse is generated and applied, if the MOSFET switching element 20 is in a non-conducting state. If the MOSFET switching element 20 is in a conducting state, the generation and application of a testing voltage pulse on the side of the drain terminal 24 cannot lead to the development of a voltage difference between the source terminal 22 and the gate terminal 24, either.

To detect the voltage drop built up between the source terminal 22 and the gate terminal 24, a differential amplifier 34, at the output terminal 36 of which a signal representing this voltage drop is generated and is available for further analysis, is associated with the MOSFET switching element 20. The differential amplifier 34 and the testing voltage pulse generating device 30 form parts of a switching state testing controller, which also includes a control and analysis unit 40. The control and analysis unit 40 is a processor or computer operatively connected to the differential amplifier 34 and the testing voltage pulse generating device 30. The control and analysis unit 40 is configured with circuitry and/or programs stored therein to control the testing voltage pulse generating device 30 to apply at least one testing voltage pulse, to the drain terminal 24 of the MOSFET switching element 20 to subject the MOSFET switching element 20 to a switching state test. A voltage drop, between the drain terminal 24 and the source terminal 22 of the MOSFET switching element 20 being subjected to the state TEST, is detected with the differential amplifier 34. Based on an operative connection of the control and analysis unit 40 with the differential amplifier 34, the control and analysis unit 40 compares the voltage drop detected with a voltage reference or with a time reference or with both a voltage reference and with a time reference (stored in a memory of/associated with the control and analysis unit 40). The control and analysis unit 40 determines, based on the comparison, an actual switching state of the MOSFET switching element 20.

Figure 2:
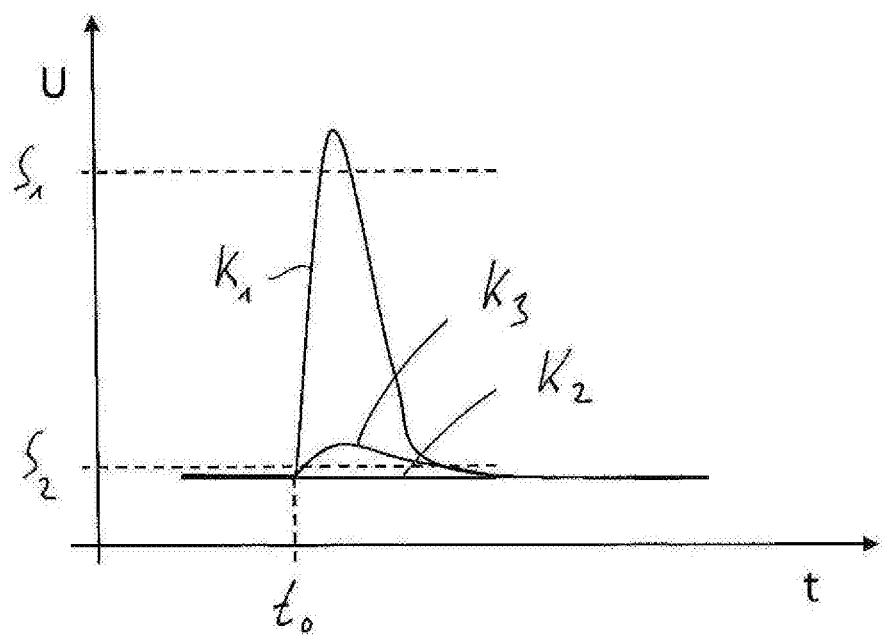
FIG. 2 is a graph view showing a voltage drop developing between the drain terminal and the source terminal of a MOSFET switching element on application of a testing voltage pulse for different switching states of a MOSFET switching element tested with a method according to the present invention.

The operation of the circuit breaker device 10 shown schematically in FIG. 1 during the testing of the switching state of said circuit breaker device will be explained below with reference to FIG. 2. Plotted over the time t, FIG. 2 shows the voltage drop detected by the differential amplifier 34 between the drain terminal 24 and the source terminal 22.

It shall be assumed at first that a testing voltage pulse is generated and applied to the drain terminal 24 at the time t0. In a state in which the MOSFET switching element 20 is not conducting, i.e., in a disconnection state disconnecting the two voltage networks 12, 14 from one another, a potential difference, which exceeds a first voltage threshold S1, builds up corresponding to curve K1. The charge carriers applied to the drain terminal 24 via the capacitor 32 flow off via the generally low-impedance second voltage network 14, so that the potential predefined at the drain terminal 24 returns to the initial value that was present prior to the application of the testing voltage pulse after a comparatively short duration in the range of about 10 μsec. The circumstance that the first voltage threshold S1 is exceeded indicates that the MOSFET switching element 20 is blocking, i.e., is non-conducting. It is also possible in this connection to take into consideration the duration until, for example, the first voltage threshold S1 is undershot or until the return into the range of the initial value, for example, until a subsequently explained second voltage threshold S2 is undershot, because, for example, an excessively rapid drainage of the charge carriers suggests that discharge does not take place or it does not take place over the second voltage network 14, but also over the MOSFET switching element 20, which should not happen in case of MOSFET switching elements 20 connected into the disconnection switching state. As an alternative or in addition to the voltage reference, a time reference may consequently also be predefined for the analysis of the curve of the drain-source voltage in order thus to be able to obtain even more detailed information on the existing switching state.

If the MOSFET switching element 20 is switched into its conducting state by the application of a switching voltage by means of the gate driver 26, i.e., if the connection switching state is present, a potential difference is also unable to develop between the two terminals 22, 24 even if the testing voltage pulse is applied to the drain terminal 24. This means that corresponding to curve K2 in FIG. 2, the differential amplifier 34 will not detect a potential difference and no voltage drop between the terminals 24, 22. The voltage threshold S2 located at or comparatively slightly above the initial value will not be exceeded in this connection switching state. This circumstance, namely, that the second voltage threshold S2 is not exceeded, thus indicates that the connection switching state is present.

Curve K3 shows a state in which a potential difference exceeding the second voltage threshold S2 but not the first voltage threshold S1 does develop between the terminals 24 and 22 when the testing voltage pulse is applied to the drain terminal 24. This means that regardless of whether the MOSFET switching element 20 is switched into its conducting state or is or should be in its non-conducting state, neither of these two states is correctly present. Consequently, curve K3 indicates an incorrect operation of the MOSFET switching element 20, because this switching element shall assume basically only two states, namely, either the conducting state or the non-conducting state.

The particular switching state of the two possible switching states which the MOSFET switching element 20 or the circuit breaker device 10 currently assumes or optionally the presence of a possible defect can thus be inferred on the basis of the potential difference detected by means of the differential amplifier 34 between the two terminals 22, 24. After comparison of the voltage drop detected by the differential amplifier 34 between the terminals 22, 24 with the voltage thresholds S1, S2 used as a voltage reference or/and with a time reference predefined by one or more time thresholds and hence after determining the particular actual switching state assumed by the MOSFET switching element 20 or the circuit breaker device 10, it can be verified, by additionally taking into account the information as to the state which the MOSFET switching element 20 or the circuit breaker device 10 should assume, i.e., the information as to which desired switching state is present, whether this is, indeed the case or not.

If, for example, the disconnection switching state is predefined as the desired switching state and it is recognized, e.g., by comparison with the voltage thresholds S1, S2, that the voltage threshold S1 is exceeded, i.e., the MOSFET switching element 20 is in its non-conducting state, it can be recognized that the actual switching state of the MOSFET switching element 20 does actually correspond to the desired switching state. The system can then continue to be operated, for example, in the desired manner.

If it is recognized in a state in which the disconnection switching state is predefined as the desired switching state that the first voltage threshold S1 is not exceeded, it can be determined, regardless of whether or not the second voltage threshold S2 is exceeded, that the actual switching state does not correspond to the desired switching state. This information can be used, for example, to operate the system in a safe operating state, in which it is guaranteed that not even a connection of the two voltage networks 12, 14, which is brought about by a defective or possibly incorrectly switched MOSFET switch, can lead to an impairment of the operation, especially to a safety-relevant impairment of different system areas.

If the connection switching state is predefined as the desired switching state and if exceeding of the second voltage threshold S2 is not detected when a testing voltage pulse is applied to the drain terminal 24, this can be considered to indicate that the MOSFET switching element 20 or the circuit breaker device 10 is indeed in the connection switching state, so that the two voltage networks 12, 14 can be used to the extent intended for this state. If the voltage drop detected by the differential amplifier 34 exceeds the second voltage threshold S2, this indicates that an unusually high voltage drop develops in a state in which the MOSFET switching element 20 should be fully conducting per se, which indicates that the MOSFET switching element 20 is either defective or is not connected correctly. This information can then also be used to ensure that an impairment of the operation, especially a safety-relevant impairment, will not develop due to a disconnection of the two voltage networks 12, 14, which disconnection is not expected per se. In particular, a warning can be generated whenever the actual switching state does not correspond to the desired switching state in order to alert the operator that the circuit breaker device 10 or at least a MOSFET switching element 20 thereof is not operating correctly.

To increase the accuracy of the detection in the procedure according to the present invention, a plurality of testing voltage pulses can consecutively be applied to the drain terminal 24. If the plurality or a majority of the voltage drops thus detected indicate the presence of a certain actual switching state, it can indeed be assumed for reasons of plausibility that this state is also actually present. An incorrect recognition of the presence of a switching state that is not actually set can thus be avoided when a voltage drop inconsistent with the actually present switching state is detected based on short-term disturbances or voltage fluctuations in one or more of the analyzed testing voltage pulses.

Since such a circuit breaker device 10 generally has a plurality of MOSFET switching elements 20 connected in parallel to one another in the case of power circuit breaker devices, the above-described procedure may, of course, be carried out for testing said switching elements in each MOSFET switching element of such a circuit breaker device 10.

Since the information that a certain desired switching state was indeed achieved is of particular significance for the operation of a system, for example, of a vehicle, with two such voltage networks 12, 14, when a switching operation is carried out, it is especially advantageous to carry out the testing procedure according to the present invention when a changeover from one switching state into another switching state was brought about by corresponding actuation. It can now be verified that the desired switching state to be assumed was indeed achieved in order subsequently to initiate further operating steps. Before restarting an internal combustion engine with the use of the voltage network 12 or the voltage source 16 thereof by switching the circuit breaker device 10 or the MOSFET switching element 20 first into the disconnection state, it can be ensured, for example, that the high load on the voltage network 12, which develops during the start of an internal combustion engine, cannot also lead to a correspondingly high voltage drop in the voltage network 14 that can supply system areas of a vehicle, which are to be supplied with electrical energy during the entire operation. Consequently, if an internal combustion engine shall be restarted starting from a state in which the two voltage networks 12, 14 are first connected to one another by the circuit breaker device 10, but an internal combustion engine is nevertheless put temporarily out of operation, the circuit breaker device 10 can first be brought into the disconnection switching state and the presence of this disconnection switching state can be verified in the above-described manner. If it is recognized that the actual switching state is the disconnection switching state, i.e., the two voltage networks 12, 14 are disconnected from one another, the voltage network 12 can then be used to start the internal combustion engine. If it is recognized that even after switching into the disconnection switching state, i.e., after predefining the disconnection switching state as the desired switching state, this state is not actually present and a starting operation then carried out could lead to a safety-relevant impairment of the functionality of the voltage network 14, safety measures can be taken to avoid this. For example, the restart of the internal combustion engine can be prevented in such a state.

To guarantee even when the circuit breaker device 210 remains in an unchanged switching state over a rather long time period that this switching state has not changed due to a defect that may have meanwhile occurred in one or more MOSFET switching elements, the above-described testing can also be carried out, for example, periodically, during such a continuous operation in order to verify that the current actual switching state does indeed correspond to the predefined desired switching state.

It should finally be noted that the procedure according to the present invention can be used not only in connection with a circuit breaker device, which shall connect, for example, voltage networks as circuit areas to one another or disconnect them from each other. A circuit breaker device, which connects, for example, a voltage source to one or more electrical energy consumers, for example, drive motors in electrically driven vehicles, can also be tested for its switching state with the procedure according to the present invention. The method according to the present invention may also be used in connection with circuit breaker devices that use one or more other switching elements, e.g., switching relays, to establish or break the connection of two circuit areas.

While specific embodiments of the invention have been shown and described in detail to illustrate the application of the principles of the invention, it will be understood that the invention may be embodied otherwise without departing from such principles.

What is claimed is:

1. A method for testing the switching state of a circuit breaker device for establishing/breaking a connection of two circuit areas, the method comprising the steps of:
    providing the circuit breaker device comprising at least one MOSFET switching element with a source terminal connected with a first of the circuit areas and a drain terminal connected with a second of the circuit areas and with a gate driver associated with the at least one MOSFET switching element for switching the at least one MOSFET switching element into a connection switching state connecting the two circuit areas to one another;
    applying at least one testing voltage pulse to the drain terminal of the at least one MOSFET switching element;
    detecting a voltage drop between the drain terminal and the source terminal of the at least one MOSFET switching element;
    comparing the voltage drop detected with a voltage reference; and
    determining, based on the comparison, an actual switching state of the at least one MOSFET switching element, the voltage reference comprising a first voltage threshold, wherein in the comparing step if the voltage drop is above the first voltage threshold, it is determined in the step of determining an actual switching state, that the actual switching state is a disconnection switching state.

2. The method in accordance with claim 1, wherein the at least one testing voltage pulse has a voltage in the range of 1 V to 4 V.

3. The method in accordance with claim 1, wherein the at least one testing voltage pulse represents a potential difference relative to the source terminal of the at least one MOSFET switching element subjected to the switching state test.

4. The method in accordance with claim 1, wherein the at least one testing voltage pulse has a pulse length in the range of 5 μsec to 15 μsec.

5. The method in accordance with claim 1, wherein the voltage reference further comprises a second voltage threshold, wherein in the comparing step if the voltage drop is below the second voltage threshold, it is determined in the step of determining an actual switching state, that the actual switching state is the connection switching state.

6. The method in accordance with claim 1, further comprising:
    comparing the actual switching state determined in the step of determining an actual switching state with a desired switching state of the at least one MOSFET switching element; and
    if the actual switching state corresponds to the desired switching state, recognizing a correct function of the at least one MOSFET switching element, or
    if the actual switching state does not correspond to the desired switching state, recognizing a malfunction of the at least one MOSFET switching element; or
    if the actual switching state corresponds to the desired switching state, recognizing a correct function of the at least one MOSFET switching element and if the actual switching state does not correspond to the desired switching state, recognizing a malfunction of the at least one MOSFET switching element.

7. The method in accordance with claim 1, wherein the actual switching state of the at least one MOSFET switching element is determined within a predefined testing time interval after a change in a desired switching state of the at least one MOSFET switching element.

8. The method in accordance with claim 1, wherein the actual switching state of the at least one MOSFET switching element is determined periodically repeatedly.

9. The method in accordance with claim 1, wherein the provided circuit breaker device further comprises a testing voltage pulse generation device with a capacitance to source terminal, and the at least one testing voltage pulse is applied to the drain terminal of the at least one MOSFET switching element being subjected to the switching state test via the capacitance to source terminal.

10. The method in accordance with claim 1, wherein the first circuit area comprises a first voltage network with a first voltage source and the second circuit area comprises a second voltage network with a second voltage source.

11. The method in accordance with claim 1, wherein:
    the circuit breaker device is provided in a vehicle; and
    the first voltage network and the second voltage network are networks of the vehicle.

12. The method in accordance with claim 1, wherein the at least one testing voltage pulse has a voltage of about 2 V.

13. The method in accordance with claim 1, wherein the at least one testing voltage pulse has a pulse length of about 10 μsec.

14. The method in accordance with claim 1, further comprising:
    providing a testing pulse generator connected to the at least one MOSFET switching element, wherein the at least one testing voltage pulse is generated via the testing pulse generator.

15. A method for testing a circuit breaker switching state, the method comprising the steps of:
- providing a circuit breaker device for establishing/breaking a connection of two circuit areas, the circuit breaker device comprising a switching arrangement comprising at least one switching element, wherein a first terminal of the at least one switching arrangement is in connection with a first of the circuit areas and a second terminal of the switching arrangement is in connection with a second of the circuit areas and wherein at least one switching terminal is provided in the switching arrangement for switching the switching arrangement into a connection switching state connecting the two circuit areas to one another;
- applying at least one testing voltage pulse to the first terminal or to the second terminal of the switching arrangement;
- detecting a voltage drop between the second terminal and the first terminal of the switching arrangement;
- comparing the voltage drop detected with a voltage reference; and
- determining, based on the comparison, an actual switching state of the switching arrangement, the voltage reference comprising a disconnection switching state voltage threshold, wherein in the comparing step if the voltage drop is above the disconnection switching state voltage threshold, it is determined in the step of determining an actual switching state, that the actual switching state is a disconnection switching state.

16. A circuit breaker device for establishing a connection of two circuit areas in a vehicle and for breaking a connection of two circuit areas in a vehicle, the device comprising:
- at least one MOSFET switching element comprising a source terminal in connection with a first of the two circuit areas and a drain terminal in connection with a second of the two circuit areas;
- a gate driver is associated with the at least one MOSFET switching element for switching the at least one MOSFET switching element into a connection switching state connecting the two circuit areas to one another; and
- a switching state testing controller configured to apply at least one testing voltage pulse to the drain terminal of at least one MOSFET switching element to subject the at least one MOSFET switching element to a switching state test, configured to detect a voltage drop between the drain terminal and the source terminal of the at least one MOSFET switching element being subjected to the state TEST, configured to compare the voltage drop detected with a voltage reference, and configured to determine, based on the comparison, an actual switching state of the at least one MOSFET switching element subjected to the switching state test, the voltage reference comprising a disconnection switching state voltage threshold, wherein, if the voltage drop is above the disconnection switching state voltage threshold, it is determined that the actual switching state is a disconnection switching state.

17. The circuit breaker device according to claim 16, wherein the switching state testing controller comprises:
- a testing voltage pulse generating device;
- a differential amplifier; and
- a control and analysis unit, wherein:
- the control and analysis unit is configured to control the testing voltage pulse generating device to apply at least one testing voltage pulse, to the drain terminal;
- the differential amplifier is configured to detect the voltage drop between the drain terminal and the source terminal;
- the control and analysis unit is configured to compare the voltage drop detected with a voltage reference or with a time reference or with both a voltage reference and with a time reference; and
- the control and analysis unit is configured to determine, based on the comparison, an actual switching state of the MOSFET switching element.

18. The circuit breaker device according to claim 16, wherein the switching state testing controller comprises a testing voltage pulse generating device, the testing voltage pulse generating device being connected to the at least one MOSFET switching element, wherein the at least one testing voltage pulse is generated via the testing pulse generator.

19. A circuit breaker device for establishing a connection of two circuit areas in a vehicle and breaking connection of two circuit areas in a vehicle, the device comprising:
- at least one switching element comprising a first terminal in connection with a first of the two circuit areas, a second terminal in connection with a second of the two circuit areas, and a switching terminal for switching the at least one switching element into a connection switching state connecting the two circuit areas to one another; and
- a switching state testing controller configured to apply at least one testing voltage pulse to the first terminal or to the second terminal, configured to detect a voltage drop between the second terminal and the first terminal of the at least one switching element, configured to compare the voltage drop detected with a voltage reference and configured to determine, based on the comparison, an actual switching state of the at least one switching element, the voltage reference comprising a disconnection switching state voltage threshold, wherein in the comparing step if the voltage drop is above the disconnection switching state voltage threshold, it is determined that the actual switching state is a disconnection switching state.

20. The circuit breaker device according to claim 19, wherein the switching state testing controller comprises:
- a testing voltage pulse generating device;
- a differential amplifier; and
- a control and analysis unit, wherein:
- the control and analysis unit is configured to control the testing voltage pulse generating device to apply at least one testing voltage pulse, to the first terminal or to the second terminal;
- the differential amplifier is configured to detect the voltage drop between the second terminal and the first terminal;
- the control and analysis unit is configured to compare the voltage drop detected with a voltage reference or with a time reference or with both a voltage reference and with a time reference; and
- the control and analysis unit is configured to determine, based on the comparison, an actual switching state of the at least one switching element.

* * * * *